United States Patent
Tseng et al.

(10) Patent No.: US 7,224,068 B2
(45) Date of Patent: May 29, 2007

(54) STABLE METAL STRUCTURE WITH TUNGSTEN PLUG

(75) Inventors: Horng-Huei Tseng, HsinChu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 256 days.

(21) Appl. No.: 10/919,875

(22) Filed: Aug. 17, 2004

(65) Prior Publication Data

US 2005/0224986 A1    Oct. 13, 2005

Related U.S. Application Data

(60) Provisional application No. 60/559,857, filed on Apr. 6, 2004.

(51) Int. Cl.
    *H01L 23/48*    (2006.01)
(52) U.S. Cl. ............... 257/774; 257/758; 257/E23.011; 438/672
(58) Field of Classification Search ......... 257/762, 257/774, 758, E23.001, E23.011, 700; 438/687, 438/675, 672
    See application file for complete search history.

(56) References Cited

U.S. PATENT DOCUMENTS 5,726,499 A * 3/1998 Irinoda .................. 257/774
6,548,901 B1 * 4/2003 Cote et al. .............. 257/758
6,593,653 B2 * 7/2003 Sundararajan et al. ...... 257/751
6,677,679 B1 * 1/2004 You et al. ................ 257/758
6,713,874 B1 * 3/2004 Hopper et al. ............ 257/760
6,815,329 B2 * 11/2004 Babich et al. ........... 438/619
6,841,844 B2 * 1/2005 Hsu et al. ................ 257/522
6,917,108 B2 * 7/2005 Fitzsimmons et al. ...... 257/751

OTHER PUBLICATIONS

Chapter 4: Capacitance Model, BSIM3v3 Manual, UC Berkeley, 1995, http://bentgroup.stanford.edu/files/Flory_web.pdf.

* cited by examiner

*Primary Examiner*—Evan Pert
*Assistant Examiner*—Victor A. Mandala, Jr.
(74) *Attorney, Agent, or Firm*—Slater & Matsil, L.L.P.

(57) ABSTRACT

In the preferred embodiment, a thick regular-k dielectric is formed on a substrate. A tungsten plug is formed in the thick regular-k dielectric. The thick regular-k dielectric is recessed and a thin low-k dielectric is formed on the thick regular-k dielectric. The thin low-k dielectric acts as a glue layer and as an etch stop layer. A thick low-k dielectric is formed on the thin low-k material. Optionally, an opening is formed through the thick low-k dielectric to expose the tungsten plug. The opening is then filled with copper or copper alloys.

32 Claims, 5 Drawing Sheets

STABLE METAL STRUCTURE WITH TUNGSTEN PLUG

This application claims priority to Provisional Application Ser. No. 60/559,857, filed on Apr. 6, 2004, and entitled "Stable Metal Structure with Tungsten Plug", which application is hereby incorporated herein by reference.

TECHNICAL FIELD

This invention relates generally to integrated circuit structures, and more specifically to inter level dielectrics.

BACKGROUND

As integrated circuit scaling proceeds into the deep submicron regime, the number of transistors on high performance, high density ICs is in the tens of millions, in accordance with the historical trend of Moore's Law. This has necessitated that such ICs feature multiple layers of high-density metal interconnects, and that the layers be separated by inter level dielectrics (ILD), also sometimes known as inter-metal dielectrics (IMD). The parasitic capacitance associated with these metal interconnections has become a major factor that limits the circuit speed of such high performance ICs. A conventional ILD (also known as regular-k dielectric) typically has a dielectric constant (also known as k value) of about 3.8 to about 8.0. However, the relatively high-k value of the regular-k dielectrics results in high parasitic capacitance. Recently, low-k dielectrics such as CVD black diamond (a trademark of Applied Materials), which has a k value of about 3.0, have been widely used by the semiconductor industry to reduce the parasitic capacitance between the metal lines, hence improving circuit performance. The k value of $SiO_2$ (about 3.8 to 4.2) is typically used as the dividing line between a low-k and a regular-k.

However, low-k materials cannot be used as the first level dielectric since their physical and chemical properties are significantly different from the regular-k materials. For example, low-k materials typically have high leakage current, low breakdown voltage, bad adhesion to caps and liners, and low thermal stability, so that using a low-k material close to the devices may degrade performance.

To solve the parasitic capacitance problem, a composite structure consisting of two layers is frequently used. The layer close to the devices is formed of regular-k materials, and the layer away from the devices is formed of low-k materials. This effectively lowers the parasitic capacitance. However, a new problem is introduced. In a metal structure comprising a regular-k dielectric, in which tungsten (including a conductor liner/barrier such as titanium nitride) is typically used as contact plugs and a thick low-k dielectric, the adhesion between the thick regular-k dielectric and the thick low-k dielectric is not stable. This will lead to film delamination and in turn cause low chip yield.

SUMMARY OF THE INVENTION

The preferred embodiment enhances the adhesion between a thick regular-k dielectric and a thick low-k dielectric by recessing the thick regular-k dielectric and then forming a thin low-k dielectric between a thick regular-k material and a thick low-k dielectric.

The thin low-k dielectric improves the adhesion between the thick regular-k dielectric and the thick low-k dielectric. The greater the recessing distance, the better the adhesion between the thick regular-k and the thick low-k dielectrics since in addition to contacting the first dielectric, the recessing makes the second dielectric contact the sidewall surface of the liner/barrier and this further enhances adhesion.

In the preferred embodiment, a thick regular-k dielectric is formed on a substrate. A tungsten plug is formed in the high-k dielectric. The thick regular-k dielectric is recessed and a thin low-k dielectric is formed on the thick high-k dielectric. The thin low-k dielectric acts as a glue layer and as an etch stop layer. A thick low-k dielectric is formed on the thin low-k material. Optionally, an opening is formed through the third dielectric to expose the tungsten plug. The opening is then filled with copper or copper alloys.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
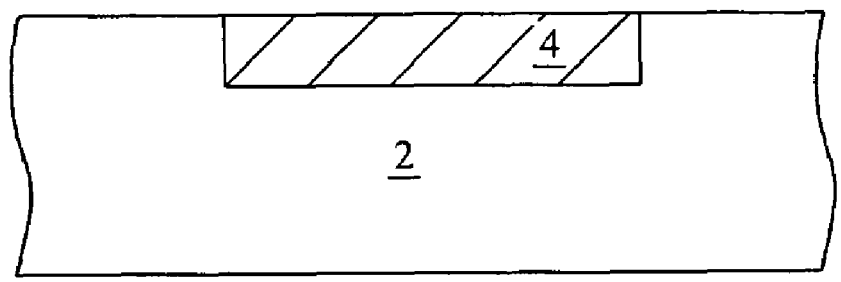
FIGS. 1 through 9 are cross-sectional views of intermediate stages in the manufacturing of a preferred integrated circuit structure embodiment.

FIGS. 1 through 10 illustrate preferred embodiments of the present invention. FIG. 1 illustrates an electrical conductive region 4 and a substrate 2. In a preferred embodiment, electrical conductive region 4 is a source/drain formed of materials that are epitaxially grown in recesses formed in substrate 2. In another embodiment, region 4 is a source/drain epitaxially deposited on substrate 2 using know epitaxy techniques. In yet other embodiments, electrical conductive region 4 is a gate structure (not shown) where a gate electrode is formed on substrate 2.

The electrical conductive region 4 may also include a silicide formed at the top of the source/drain or a gate poly. Silicide improves the contact between the underlying region and the metal contact plug that is formed in subsequent steps. It should also be appreciated that region 4 may be formed of many materials that are used in IC fabrication. For example, region 4 may be a metal line or a composite metal line that connects another layer of the integrated circuit. It is also appreciated that substrate 2 merely illustrates one of the many environments for region 4. Substrate 2 may be a silicon substrate, or other materials such as silicon germanium (SiGe), bulk semiconductor, multi-layer semiconductor or silicon-on-insulator (SOI), silicon germanium on insulator (SiGeOI), or germanium on insulator (GeOI) for example.

Figure 2:
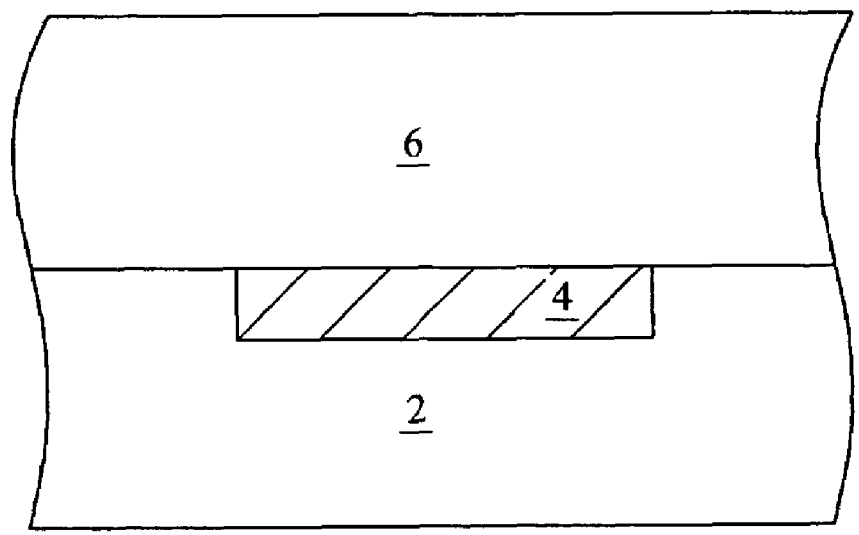

Next, as shown in FIG. 2, a thick regular-k inter level dielectric (ILD) 6 is deposited on substrate 2 and electrical conductive region 4. As is known in the art, ILD layer 6 provides insulation between the devices and the overlying metal lines that are formed subsequently. Thick regular-k dielectric 6 is also referred as first dielectric 6 throughout the description of the preferred embodiments. First dielectric 6 is preferably a regular-k dielectric, and the k value of the first dielectric 6 is between about 3.3 and about 4.3, and more preferably about 4.0. In a preferred embodiment, the first dielectric 6 is phosphosilicate glass (PSG), which has a k value of about 4.0. In other embodiments, the first dielectric 6 is silicon nitride or silicon oxide deposited using, e.g., plasma-enhanced chemical vapor deposition (PECVD), high density plasma chemical vapor deposition (HDP CVD), low pressure chemical vapor deposition (LPCVD), sub-atmosphere chemical vapor deposition (SACVD), or other well-known deposition techniques. The first dielectric 6 is preferably formed to a thickness of about 2000 Å to about 8000 Å, and more preferably about 5000 Å. It is to be noted that the low-k materials with a k value less than about 3.8 are generally not used as the first dielectric layer close to the devices since their physical and chemical properties are significantly different from the regular-k material. For example, low-k materials typically have high leakage current, low breakdown voltage, bad adhesion to caps and liners, and low thermal stability, so that using low-k material close to the devices may degrade performance.

Figure 3:
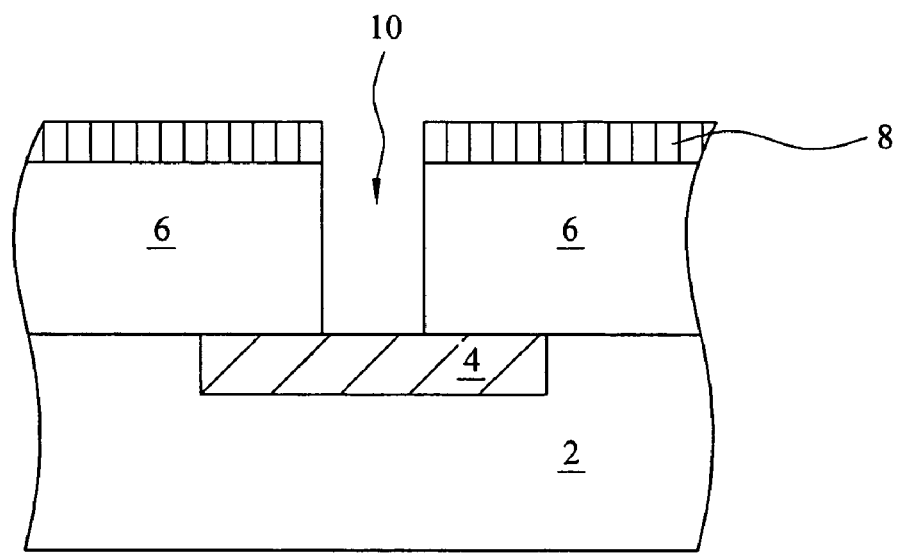

Also shown in FIG. 3, a photo resist 8 is formed and patterned on the first dielectric 6. Opening 10 is then formed in the first dielectric 6. The formation of opening 10 is known in the art. Then, the photo resist 8 is completely removed by a resist stripping process.

Figure 4:
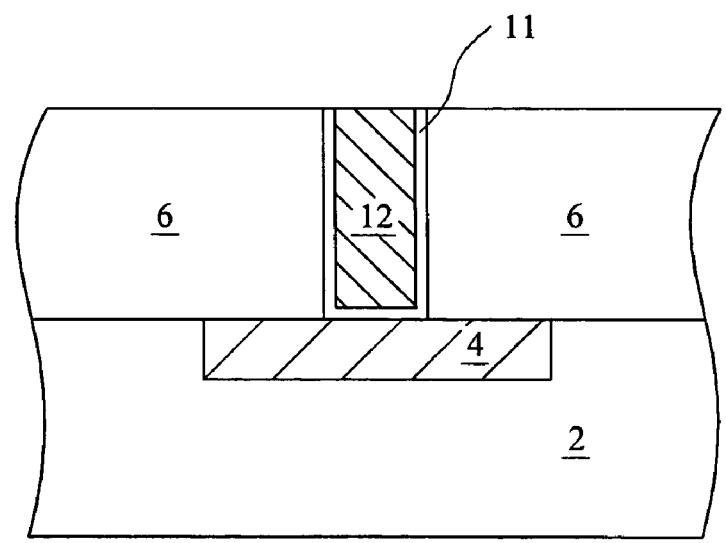

FIG. 4 illustrates a barrier 11 (also known as a liner) formed in the contact opening 10 along the side walls and the bottom. The barrier 11 is preferably formed of titanium nitride (TiN). Other materials such as TaN and TiSiN can also be used. TiN is an effective barrier that is used to prevent the migration of contact metals into the first dielectric 6. TiN also serves as a glue layer to enhance the adhesion of tungsten plugs to first dielectric 6. Typically, barrier 11 is formed by chemical vapor deposition (PECVD). It may also be formed by physical vapor deposition (PVD). The thickness of the barrier 11 is preferably about 50 Å to about 300 Å, and more preferably 100-150 Å.

The remaining part of contact opening 10 is filled by a contact plug 12, as illustrated in FIG. 4. In the preferred embodiment, the material of the contact plug 12 is tungsten deposited by CVD from hexafluoride, or $WF_6$. In other embodiments, contact opening 10 may be filled with aluminum or other materials such as copper and copper alloys. The method of forming such materials is known in the art.

Figure 5:
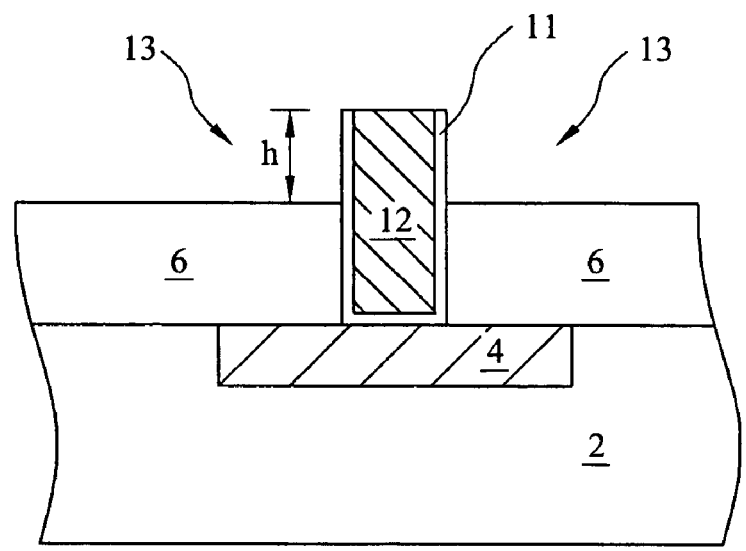

FIG. 5 illustrates that the first dielectric 6 is recessed. Preferably, the recessing 13 is performed by chemical mechanical polishing (CMP), plasma etching or wet etching. It is to be appreciated that the recessing distance h affects adhesion between the first dielectric 6 and the low-k dielectric that will be formed later. The greater the recessing distance, the better the adhesion as the greater recessing distance provides more surface to be contacted with the second dielectric. In addition, the greater distance will further enhance the anchoring effect. The preferred depth h of the recessing 13, which is from the top end of contact plug 12 to the top surface of first dielectric 6, is about 100 Å to about 1000 Å. More preferably it is about 150 Å to about 350 Å, 350 Å to about 500 Å, and even more preferably about 500 Å to about 1000 Å.

Figure 6:
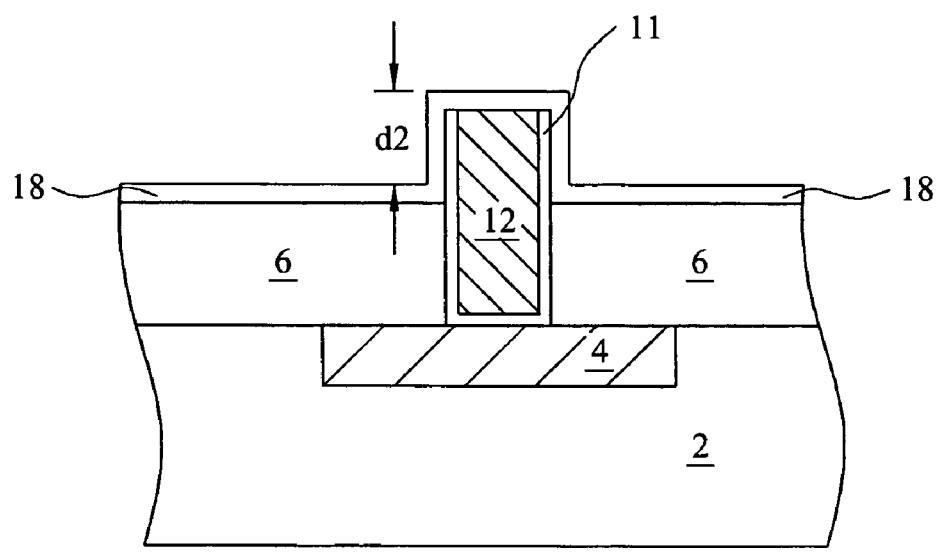

FIG. 6 illustrates a thin second dielectric 18 formed on the first dielectric 6 and the contact plug 12. The second dielectric 18 is an intermediate layer having better bonding strength with both the first dielectric 6 and the third dielectric, which will be formed on the second dielectric 18, so that it improves the adhesion between the first dielectric 6 and the third dielectric. The second dielectric 18 also acts as an etch stop layer for subsequent steps. The thickness of the second dielectric 18 is preferably less than about 600 Å to reduce capacitance in order to further improve RC delay time. The vertical distance $d_2$ (as shown in FIG. 6) between the topmost surface of contact plug 12 and the topmost surface of the second dielectric 18 is preferably between about 100 Å and 500 Å.

It is desired that the second dielectric 18 be a good adhesive to a low-k third dielectric, and the k value of the second dielectric 18 is higher than the k value of the third dielectric to serve as a good etch stop layer. It is also desirable that the thickness of the second dielectric 18 be less than 600 Å to reduce capacitance to further improve RC delay time. The dielectric 18 has a preferred k value of less than about 5. In a preferred embodiment, a material comprising silicon and carbon such as silicon carbide (SiC) with a k value of around 4.0 or carbon-doped silicon oxide is used as the adhesion and etch stop layer between a PSG (with k~4.2) and a CVD black diamond (with k ~3.0).

Figure 7:
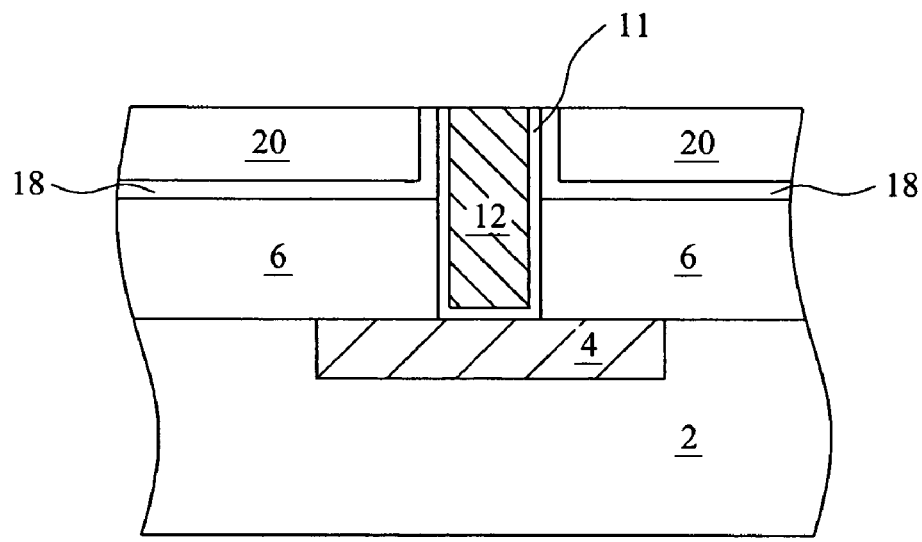

A third dielectric 20 is formed on the second dielectric 18, as illustrated in FIG. 7. The third dielectric 20 preferably has a thickness of about 1500 Å to about 5000 Å, and more preferably about 2500 Å. In a preferred embodiment, the third dielectric 20 is black diamond with a k value of about 3.0. In other embodiments, organic low-k dielectric formed by a spin-on method such as SiCOH, and methyl-silesquioxane can also be used. The k value of the third dielectric 20 is preferably less than about 3.2. The preferred method is CVD, but other known methods, such as spin-on, can also be used.

Figure 8:
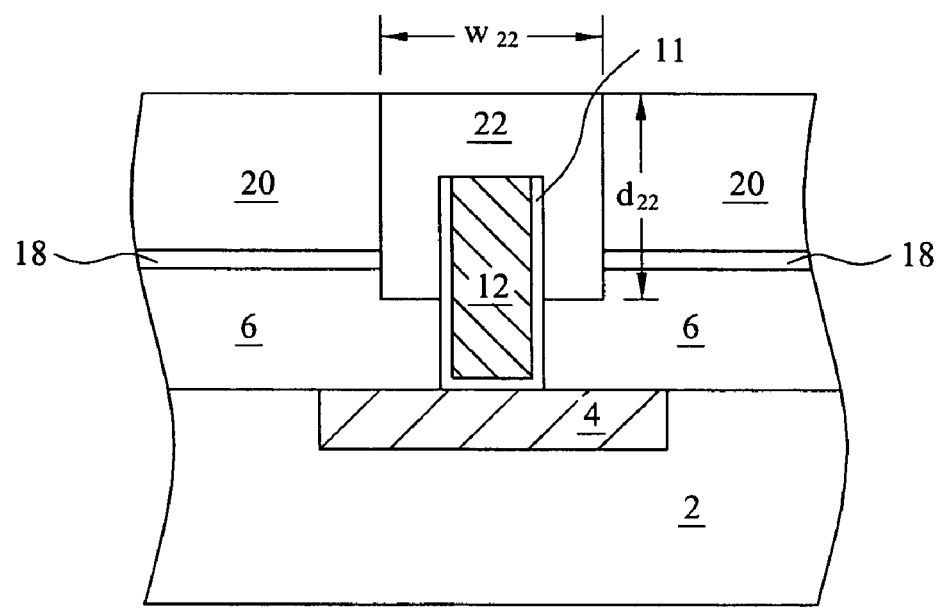

In one preferred embodiment, an opening 22 is formed through the third dielectric 20 and the second dielectric 18 to expose contact plug 12, as shown in FIG. 8. Typically the shape of the opening 22 is a trench where low-resistivity metal is disposed and serves as an interconnect line. The opening 22 is preferably wider than the contact plug 12 with a preferred width $W_{22}$ of less than about 1300 Å. The bottom of opening 22 is preferably lower than the top surface of the second dielectric 18. Opening 22 is preferably formed by plasma etching using gas chemistry comprising fluorine.

A barrier layer 23 is formed in opening 22 to prevent copper that is formed in subsequent steps from diffusing. The barrier 23 is preferably formed of tantalum nitride.

Figure 9:
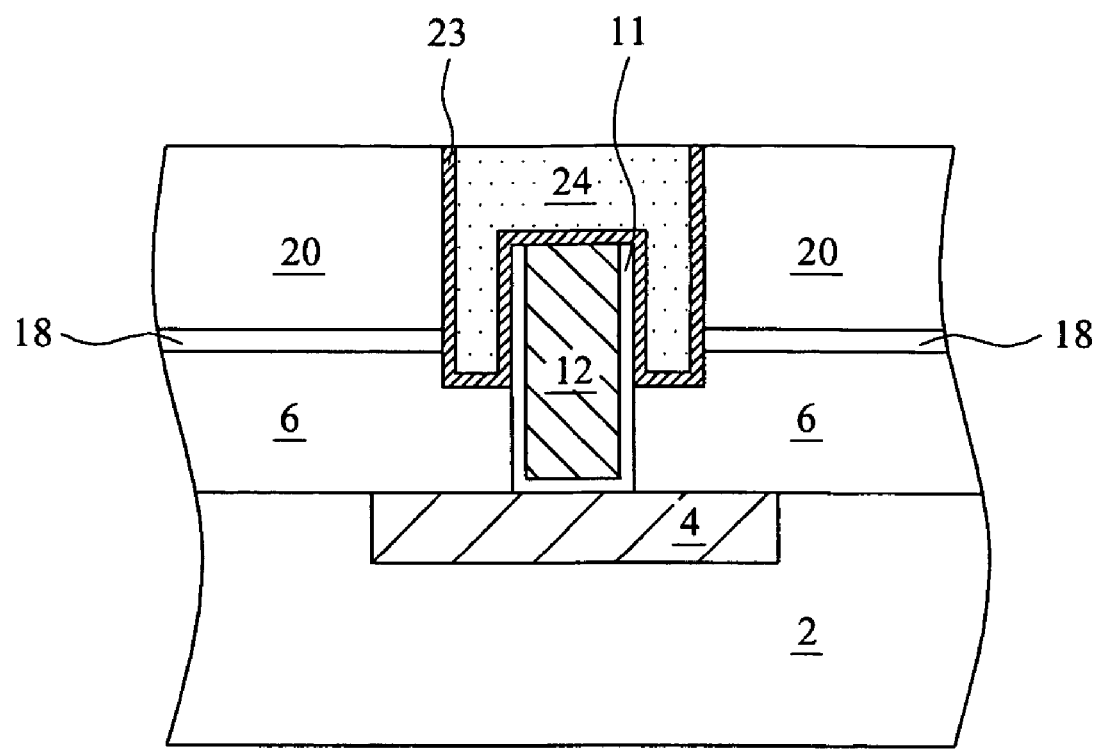

Opening 22 is then filled with conductive materials to form interconnect 24, as shown in FIG. 9. In a preferred embodiment, opening 22 is filled with a low resistivity metal such as copper or copper alloy using electrochemical plating or CVD. In other embodiments, opening 22 may be filled with aluminum or aluminum alloy. Copper or copper alloy lines 24 may preferably be formed by electrochemical plating or electro-less plating technology.

An advantageous feature of the preferred embodiments discussed above is that the adhesion between a thick regular-k dielectric and a thick low-k dielectric is improved by recessing the first dielectric 6. In general, the greater the recessing distance, the better the adhesion between the thick regular-k dielectric and the thick low-k dielectric, and the more stable the metal structure will be. The actual recessing distance is relative to the thickness of the first dielectric and the third dielectric, and one skilled in the art can find the right value through unduly experiments.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a first dielectric having a topmost surface;
   a second dielectric on the first dielectric;
   a low-k third dielectric on the second dielectric;
   a conductive plug in the first dielectric, the second dielectric and the third dielectric wherein the conductive plug has a top end and a bottom end and wherein the vertical distance between the top end of the conductive plug to the topmost surface of the first dielectric is between about 100 Å and about 1000 Å;
   an electrical conductive region electrically in contact with the conductive plug at the bottom end; and
   an interconnect in the low-k third dielectric, wherein the interconnect encloses at least part of the conductive plug at its top end.

2. The integrated circuit structure of claim 1 further comprising a silicon substrate wherein the first dielectric is formed on a silicon substrate.

3. The integrated circuit structure of claim 1 wherein the electrical conductive region comprises a material selected from the group consisting essentially of doped silicon, metal silicide, silicon germanium and a combination thereof.

4. The integrated circuit structure of claim 1 wherein the first dielectric has a dielectric constant (k value) of between about 3.3 and about 4.3 and the third dielectric has a k value of less than about 3.2.

5. The integrated circuit structure of claim 1 wherein the conductive plug has a width of less than about 1300 Å.

6. The integrated circuit structure of claim 1 wherein the vertical distance between the top end of the conductive plug and the topmost surface of the first dielectric is between about 150 Å and about 350 Å.

7. The integrated circuit structure of claim 1 wherein the vertical distance between the top end of the conductive plug and the topmost surface of the first dielectric is between about 350 Å and about 500 Å.

8. The integrated circuit structure of claim 1 wherein the vertical distance between the top end of the conductive plug and the topmost surface of the first dielectric is between about 500 Å and 1000 Å.

9. The integrated circuit structure of claim 1 wherein the second dielectric has a dielectric constant of less than about 5.

10. The integrated circuit structure of claim 1 wherein the second dielectric has a thickness of less than about 600 Å.

11. The integrated circuit structure of claim 1 wherein the material of the second dielectric comprises silicon or carbon or both.

12. The integrated circuit structure of claim 11 wherein the vertical distance between the topmost surface of the conductive plug and the topmost surface of the second dielectric is between about 100 Å and about 500 Å.

13. The integrated circuit structure of claim 1 wherein the third dielectric is organic low-k formed by a spin-on method.

14. The integrated circuit structure of claim 1 further comprising a barrier layer enclosing the interconnect.

15. The integrated circuit structure of claim 1 wherein the conductive plug is formed of tungsten and the interconnect is formed of copper or copper alloys.

16. The integrated circuit structure of claim 1 wherein the interconnect has a width of less than about 1300 Å.

17. The integrated circuit structure of claim 1, wherein the top end of the conductive plug is vertically located between a top surface and a bottom surface of the low-k third dielectric.

18. A method of making an integrated circuit structure, comprising:
   forming a first dielectric wherein the first dielectric has a topmost surface;
   forming an opening in the first dielectric;
   forming a conductive plug in the opening wherein the conductive plug has a top end and a bottom end;
   recessing the topmost surface of the first dielectric wherein the vertical distance between the top end of the conductive plug and the topmost surface of the first dielectric is between about 100 Å and about 1000 Å;
   forming a second dielectric on the first dielectric and the conductive plug;
   forming a third dielectric on the second dielectric; and
   forming an interconnect in the first dielectric, the second dielectric and the third dielectric, wherein the interconnect encloses at least part of the conductive plug at its top end.

19. The method of claim 18 wherein the conductive plug electrically contacts an electrical conductive region at the bottom end and wherein the electrical conductive region is composed of a material selected from the group consisting essentially of doped silicon, metal silicide, silicon germanium and a combination thereof.

20. The method of claim 18 wherein the first dielectric has a dielectric constant of between about 3.3 and about 4.3 and the third dielectric has a dielectric constant of less than about 3.2.

21. The method of claim 18 wherein the opening has a width of less than about 1300 Å.

22. The method of claim 18 wherein the recessing method of the first dielectric is selected from the group consisting of chemical mechanical polish (CMP), dry etching, and wet etching.

23. The method of claim 18 wherein the second dielectric has a dielectric constant of less than about 5.

24. The method of claim 18 wherein the second dielectric has a thickness of less than about 600 Å.

25. The method of claim 18 wherein the material of the second dielectric comprises silicon or carbon or both.

26. The method of claim 18 wherein the vertical distance between the topmost surface of the conductive plug and the topmost surface of the second dielectric is between about 100 Å and about 500 Å.

27. The method of claim 18 wherein the third dielectric is formed by a spin-on method.

28. The method of claim 18 further comprising the step of forming a barrier prior to the step of forming the interconnect.

29. The method of claim 18 wherein the conductive plug is formed of tungsten and the interconnect is formed of copper or copper alloys.

30. The method of claim 18 wherein the interconnect has a width of less than about 1300 Å.

31. An integrated circuit structure comprising: a first dielectric; a second dielectric on the first dielectric; a third dielectric on the second dielectric, wherein the third dielectric has a low k value; a conductive plug in the first dielectric, the second dielectric and the third dielectric; wherein the conductive plug has a top end and a bottom end, and wherein the top end of the conductive plug is vertically located between a top surface and a bottom surface of the third dielectric; and an electrical conductive region electrically in contact with the conductive plug at the bottom end, further comprising an interconnect in the third dielectric, wherein the interconnect encloses at least part of the conductive plug at its top end.

32. The integrated circuit structure of claim 31 wherein the interconnect has a bottom surface between a top surface and a bottom surface of the first dielectric.

* * * * *